(12) United States Patent
Zhou

(10) Patent No.: US 11,810,882 B2
(45) Date of Patent: Nov. 7, 2023

(54) SOLDER BASED HYBRID BONDING FOR FINE PITCH AND THIN BLT INTERCONNECTION

(71) Applicant: Micron Technology, Inc., Boise, ID (US)

(72) Inventor: Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 17/684,292

(22) Filed: Mar. 1, 2022

(65) Prior Publication Data
US 2023/0282605 A1 Sep. 7, 2023

(51) Int. Cl.
*H01L 23/00* (2006.01)

(52) U.S. Cl.
CPC .............. *H01L 24/16* (2013.01); *H01L 24/05* (2013.01); *H01L 24/11* (2013.01); *H01L 24/13* (2013.01); *H01L 24/14* (2013.01); *H01L 24/81* (2013.01); *H01L 24/83* (2013.01); *H01L 24/91* (2013.01); *H01L 24/29* (2013.01); *H01L 24/32* (2013.01); *H01L 24/73* (2013.01); *H01L 2224/0518* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05169* (2013.01); *H01L 2224/05173* (2013.01); *H01L 2224/05176* (2013.01); *H01L 2224/05178* (2013.01); *H01L 2224/05181* (2013.01); *H01L 2224/05183* (2013.01);
(Continued)

(58) Field of Classification Search
CPC ......... H01L 24/16; H01L 24/05; H01L 24/11; H01L 24/13; H01L 24/14; H01L 24/81; H01L 24/83; H01L 24/91; H01L 24/29; H01L 24/32; H01L 24/73; H01L 2224/16146; H01L 2224/2919; H01L 2224/29191; H01L 2224/32145; H01L 2224/73103; H01L 2224/81815; H01L 2224/8185
See application file for complete search history.

(56) References Cited

U.S. PATENT DOCUMENTS 11,355,468 B2 * 6/2022 Chen ...................... H01L 24/83
2016/0300807 A1 * 10/2016 Deng ...................... H01L 24/16
(Continued)

*Primary Examiner* — Douglas W Owens
(74) *Attorney, Agent, or Firm* — Perkins Coie LLP

(57) ABSTRACT

A semiconductor device assembly, comprising a first semiconductor device including a first substrate with a frontside surface, a plurality of solder bumps located on the frontside surface of the first substrate, and a first polymer layer on the frontside surface. The semiconductor device assembly also comprises a second semiconductor device including a second substrate with a backside surface, a plurality of TSVs protruding from the backside surface of the second substrate, and a second polymer layer on the backside surface of the first substrate, the second polymer layer having a plurality of openings corresponding to the plurality of TSVs. The first and second semiconductor devices are bonded such that the first polymer layer contacts the second polymer layer and each of the plurality of solder bumps extends into a corresponding one of the plurality of openings and contacts a corresponding one of the plurality of TSVs.

20 Claims, 8 Drawing Sheets

(52) U.S. Cl.
CPC ............... *H01L 2224/05184* (2013.01); *H01L 2224/05541* (2013.01); *H01L 2224/11826* (2013.01); *H01L 2224/11827* (2013.01); *H01L 2224/11845* (2013.01); *H01L 2224/11849* (2013.01); *H01L 2224/13009* (2013.01); *H01L 2224/1318* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13169* (2013.01); *H01L 2224/13173* (2013.01); *H01L 2224/13176* (2013.01); *H01L 2224/13178* (2013.01); *H01L 2224/13181* (2013.01); *H01L 2224/13183* (2013.01); *H01L 2224/13184* (2013.01); *H01L 2224/13565* (2013.01); *H01L 2224/14181* (2013.01); *H01L 2224/16146* (2013.01); *H01L 2224/2919* (2013.01); *H01L 2224/29191* (2013.01); *H01L 2224/32145* (2013.01); *H01L 2224/73103* (2013.01); *H01L 2224/8185* (2013.01); *H01L 2224/81815* (2013.01); *H01L 2924/0635* (2013.01); *H01L 2924/0665* (2013.01); *H01L 2924/07025* (2013.01)

(56) References Cited

U.S. PATENT DOCUMENTS

| 2019/0131260 A1* | 5/2019 | Kirby | ............... | H01L 24/05 |
| 2019/0131266 A1* | 5/2019 | Aoki | ............... | H01L 24/13 |
| 2022/0059483 A1* | 2/2022 | Wu | ............... | H01L 24/13 |
| 2022/0302069 A1* | 9/2022 | Chen | ............... | H01L 24/27 |

* cited by examiner

600

```
┌─────────────────────────────────────────────────────────┐
│ Process a first semiconductor device to create a cavity in a first │
│ polymer layer around a protruded through silicon via (TSV) on a │
│ backside surface of the first semiconductor device      │
│                                                   602   │
└─────────────────────────────────────────────────────────┘
                            ↓
┌─────────────────────────────────────────────────────────┐
│ Process a second semiconductor device to create a second │
│ polymer layer and a solder bump on a frontside surface of the │
│ second semiconductor device                             │
│                                                   604   │
└─────────────────────────────────────────────────────────┘
                            ↓
┌─────────────────────────────────────────────────────────┐
│ Bond the first semiconductor device to the second semiconductor │
│ device such that the first polymer layer contacts the second │
│ polymer layer and the solder bump extends into the cavity and │
│ contacts the TSV                                        │
│                                                   606   │
└─────────────────────────────────────────────────────────┘
                            ↓
┌─────────────────────────────────────────────────────────┐
│ Reflow the solder bump to wet the protruded TSV within the │
│ cavity                                            608   │
└─────────────────────────────────────────────────────────┘
```

```
┌─────────────────────────────────────────────────────────────┐
│ Etch the backside surface of the first semiconductor device to │
│         reveal the TSV protruded therefrom                  │
│                                                         702 │
└─────────────────────────────────────────────────────────────┘
                              ↓
┌─────────────────────────────────────────────────────────────┐
│ Deposit a liner on the backside surface of the first semiconductor │
│            device and on the protruded TSV                  │
│                                                         704 │
└─────────────────────────────────────────────────────────────┘
                              ↓
┌─────────────────────────────────────────────────────────────┐
│ Planarize the backside surface of the first semiconductor device to │
│            expose a top surface of the TSV                  │
│                                                         706 │
└─────────────────────────────────────────────────────────────┘
                              ↓
┌─────────────────────────────────────────────────────────────┐
│ Deposit the first polymer layer on the backside surface of the first │
│                  semiconductor device                       │
│                                                         708 │
└─────────────────────────────────────────────────────────────┘
                              ↓
┌─────────────────────────────────────────────────────────────┐
│ Pattern the first polymer layer to create the cavity around the │
│                    protruded TSV                            │
│                                                         710 │
└─────────────────────────────────────────────────────────────┘
```

*FIG. 7*

SOLDER BASED HYBRID BONDING FOR FINE PITCH AND THIN BLT INTERCONNECTION

TECHNICAL FIELD

The present disclosure generally relates to semiconductor devices, and more particularly relates to solder based hybrid semiconductor device bonding with fine pitch and thin bond-line thickness (BLT) interconnection incorporating the same.

BACKGROUND

Microelectronic devices generally have a die (i.e., a chip) that includes integrated circuitry with a high density of very small components. Typically, dice include an array of very small bond pads electrically coupled to the integrated circuitry. The bond pads are external electrical contacts through which the supply voltage, signals, etc., are transmitted to and from the integrated circuitry. After dice are formed, they are "packaged" to couple the bond pads to a larger array of electrical terminals that can be more easily coupled to the various power supply lines, signal lines, and ground lines. Conventional processes for packaging dice include electrically coupling the bond pads on the dice to an array of leads, ball pads, or other types of electrical terminals, and encapsulating the dice to protect them from environmental factors (e.g., moisture, particulates, static electricity, and physical impact).

BRIEF DESCRIPTION OF THE DRAWINGS

FIG. 6 is a flow chart illustrating a method of semiconductor device assembly with the hybrid bonding according to embodiments of the invention;

FIG. 7 is a flow chart illustrating a method of fabricating the first semiconductor device for the semiconductor device assembly according to embodiments of the invention.

Figure 1A:
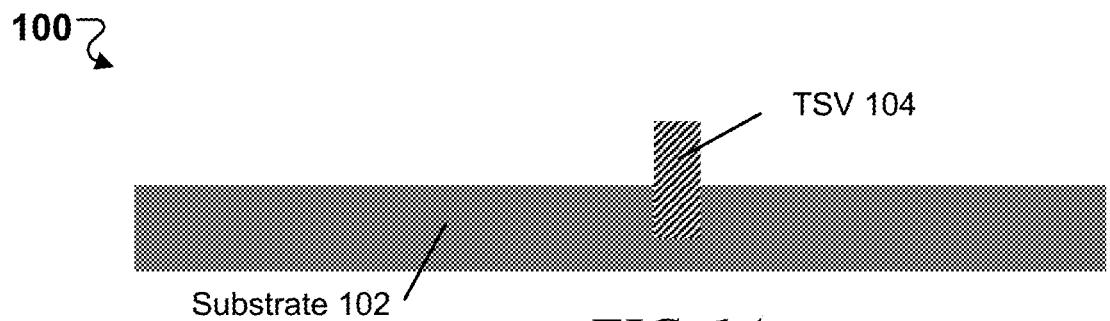
FIG. 1A-1D depict cross-section views of a first semiconductor device at various fabrication steps according to embodiments of the invention.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION 3D semiconductor device integration including die to die, die to wafer, and wafer to wafer bonding enables Moore's law continuation to obtain smaller and faster semiconductor devices. Solder bumps and through silicon via (TSV) pitches in the semiconductor device assemblies enable high density interconnects between two or more semiconductor devices for different applications. However, mechanical stability of solder bump, solder bump non-wetting, and TSV dishing are the concerns for semiconductor assemblies at finer pitches, e.g., 10 um and below. For example, there are solder bridging issue and solder non-wetting issue in traditional interconnection technologies with tight TSV pitch. In addition, openings in copper-copper bonding challenges the copper hybrid bonding based interconnection yield and requests a very tight control on copper pad dishing for 5 nm pitch and below. Moreover, the 3D semiconductor device integration requires a minimized and constant BLT for unified and reliable performance of the assembled semiconductor device.

To address these drawbacks and others, the present disclosure reveals a solder based hybrid bonding for semiconductor device assemblies including a polymer-polymer bonding and a solder-TSV bonding that are located at the interface of the stacked semiconductor devices. Specifically, the revealed semiconductor device interconnection includes a first semiconductor device having a first polymer layer, a TSV as an under-bump-metallization (UBM), and a cavity created around the TSV. The hybrid semiconductor device interconnection also includes a second semiconductor device having a second polymer layer and solder bumps formed thereon. The first and second semiconductor devices can be bonded through the polymer-polymer bonding between the first and second polymer layers, and the solder bump-TSV bonding by extending the solder bump into the cavity to contact the TSV. The semiconductor device assemblies disclosed in this disclosure accommodate the solder bump within the cavity around the TSV, therefore eliminating the BLT between the stacked semiconductor devices.

In this disclosure, the first semiconductor device can be processed to create the cavity in its first polymer layer and around a protruded TSV on a backside surface of the first semiconductor device. FIG. 1A-1D depict cross-section views of the first semiconductor device 100 at various fabrication steps according to embodiments of the invention. As shown FIG. 1A, a TSV 104 can be fabricated to protrude on a backside surface of a substrate 102 of the semiconductor device 100. In this example, the TSV 104 may be fabricated using a via-last approach, i.e., forming the TSV 104 from the backside of the substrate 102 by etching the backside of the substrate 102, a shallow trench isolation (STI) pad, and an inter-layer dielectric over the STI pad to expose a metal pad (not illustrated) through respective TSV opening. Here, the TSV 104 can be filled with any appropriate conductive materials such as copper, tungsten, molybdenum, nickel, titanium, tantalum, platinum, silver, gold, ruthenium, iridium, rhenium, rhodium, or alloys thereof. Alternatively, the TSV 104 may be formed in a via-first approach, in which a wafer thinning process may be conducted to reveal the TSV 104 from the backside of the substrate 102 using a wafer grinding or lapping tool. In another example embodiment, the TSV 104 can be fabricated to protrude on the backside surface of the substrate 102 and penetrate therethrough. For example, the TSV 104 may be formed by etching through the substrate 102 and then filling with any conductive materials. Moreover, the TSV 104 may have a height above the substrate 102 ranging from 2 um to 5 um and a diameter ranging from 2 um to 4 um.

Figure 1B:
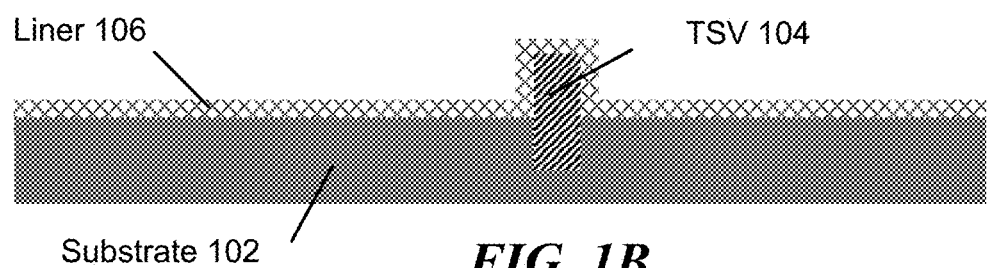
Figure 1C:
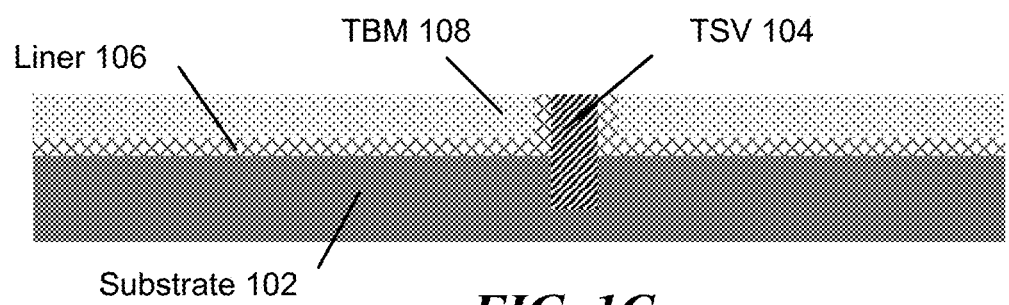

A passivation liner 106 can be further deposited on the backside surface of the substrate 102 of the first semiconductor device 100. As shown in FIG. 1B, the liner 106 can be also conformally coated on the protruded sidewall and top surface of the TSV 104. The deposition of the liner 106 may be conducted by any appropriate techniques including, chemical vapor deposition (CVD), physical vapor deposition (PVD), atomic layer deposition (ALD), or gas cluster ion beam (GCIB) deposition. In this example, the passivation liner 106 may be an insulating dielectric material, e.g., silicon oxide (SiO), silicon nitride (SiN), silicon borocarbonitride (SiBCN), silison oxycarbonitride (SiOCN), silicon oxycarbide (SiOC), silicon carbonitride (SiCN), silicon boronitride (SiBN), a low-k dielectric material, or a combination thereof. Here, the liner 106 may have a thickness ranging from 1 um to 3 um.

In the next step, the backside surface of the semiconductor device 100 can be planarized to expose the top surface of the TSV 104. The polarization may be conducted by applying a TBM material 108 as an assistance and followed by a fly cutting process. In another example embodiment, the polarization can be conducted by a chemically mechanical polishing (CMP) process with end point detection technique. Specifically, the CMP process can be performed using a chemical or granular slurry and mechanical force to gradually remove the TBM material 108. The CMP process may further remove the liner 106 from the top surface of the TSV 104 and stops thereon.

Figure 1D:
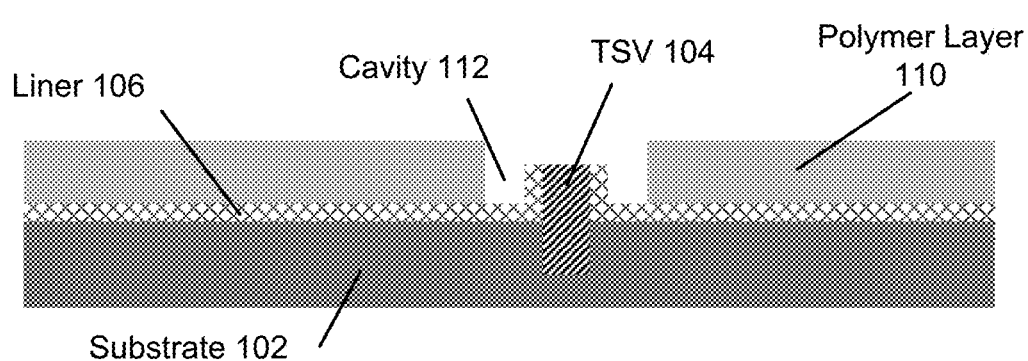

Once the top surface of the TSV 104 is exposed, the TBM material may be removed from the backside of the semiconductor device 100. The removal of the TBM material 108 can be done by wet etching technique or anisotropic etching technique, such as a reactive ion etch (RIE) process. As shown in FIG. 1D, a polymer layer 110 can be further deposited on the backside surface of the substrate 102 to assist the semiconductor device assemblies. Here, the polymer layer 110 can be deposited by vapor phased deposition techniques, for example, a CVD process or a PVD process. In this example, the polymer layer 110 can be further planarized using a planarization technique, for example, a CMP process. Moreover, a cavity 112 can be created by patterning the polymer layer 110 using a hard mask and then etching the patterned polymer away using a dry etching technique or a wet etching technique. Specifically, the cavity 112 can be formed around the protruded TSV 104 with a diameter ranging from 5 um to 10 um. Because of the process tolerance, the polymer layer polarization may not stop exactly on the top surface of the TSV 104, causing a variance between the top surface of the polymer layer and the top surface of the TSV 104. As can be seen in FIG. 1D, the top surface of the planarized polymer layer 110 may be higher than the top surface of the TSV 104 after forming the cavity 112 around the protruded TSV 104.

In another embodiment example, a passivation layer can be deposited, based on the top surface of the TSV 104 being exposed and the TBM material 108 being removed, on the backside of the substrate 102. The passivation layer can be made of insulating dielectric materials, e.g., silicon oxide (SiO), silicon nitride (SiN), silicon borocarbonitride (SiBCN), silicon oxycarbonitride (SiOCN), silicon oxycarbide (SiOC), silicon carbonitride (SiCN), silicon boronitride (SiBN), or a combination thereof. Similarly, the passivation layer can be planarized and patterned to form the cavity 112 therein and around the protruded TSV 104. Further, the processing of the semiconductor device 200 may include, after patterning the cavity 112 in the polymer/passivation layer 110, removing the liner 106 from the sidewall of the protruded TSV 104, which can be done by a wet or dry etching technique.

In another example embodiment, the semiconductor device 100 may include a plurality of TSVs protruding from the backside surface of the semiconductor device 100, each one of the plurality of TSVs having a cavity located therearound. The processes of the plurality of TSVs and corresponding cavities can be same to that of the TSV 104 described in FIGS. 1A-1D. In this example, the plurality of TSVs may have a pitch distance less than 10 um.

In this disclosure, the second semiconductor device can be processed to create the second polymer layer and a solder bump on a frontside surface of the second semiconductor device. FIG. 2A-2D depict cross-section views of the second semiconductor device 200 after fabrication operations according to embodiments of the invention. As shown FIG. 2A, a solder bump 204 can be fabricated on a frontside surface of a substrate 202 of the second semiconductor device 200. The solder bump 204 may be processed by patterning a hard mask film on the frontside of the substrate 204 followed by solder plating. The hard mask film can then be stripped off, leaving the solder bump 204 protruding at the frontside surface of the semiconductor device 200. In this example, the solder bump 204 can be made of materials including nickel, copper, gold, palladium, silver, or their alloys. In another embodiment example, the solder bump 204 may include various materials. For example, the solder bump 204 may include a nickel pillar capped with a solder alloy, a copper pillar capped with a solder alloy, or a solder alloy only. In another example embodiment, the solder bump 204 can be fabricated on the frontside surface of the substrate 202 and penetrate therethrough. For example, substrate 202 may have hard mask films on its frontside and backside surfaces. The solder bump 204 can be processed by patterning completely through the hard mask film on the frontside surface and the substrate 202, followed by the solder plating process. Here, the solder bump 204 may have a diameter ranging from 2 um to 5 um. Although not illustrated, those of skill in the art will appreciate that solder bump 204 can be connected to integrated circuitry within or upon the substrate 202 by one or more vias, traces, pads, etc.

Figure 2A:
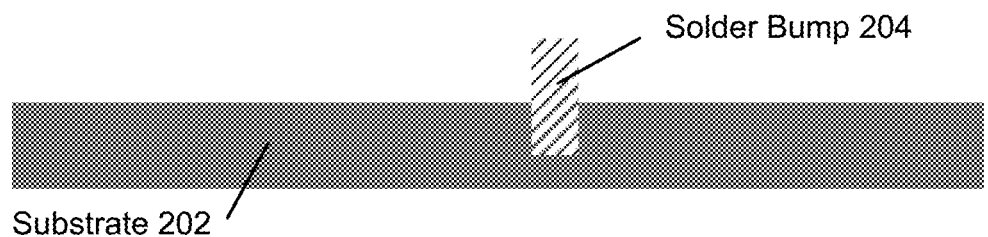
FIG. 2A-2D depict cross-section views of a second semiconductor device at various fabrication steps according to embodiments of the invention.
Figure 2B:
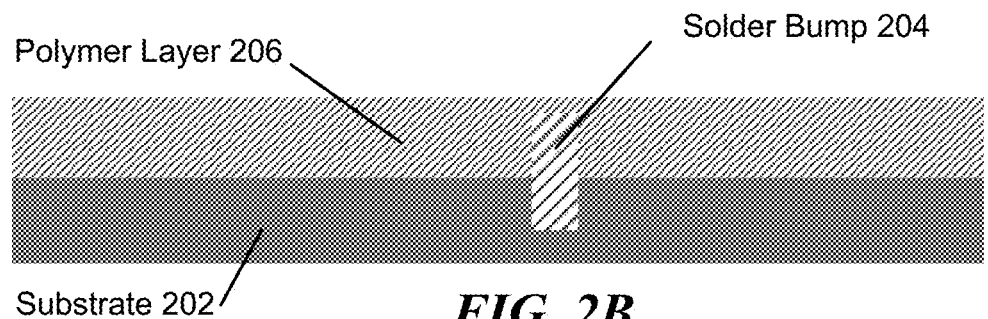
Figure 2C:
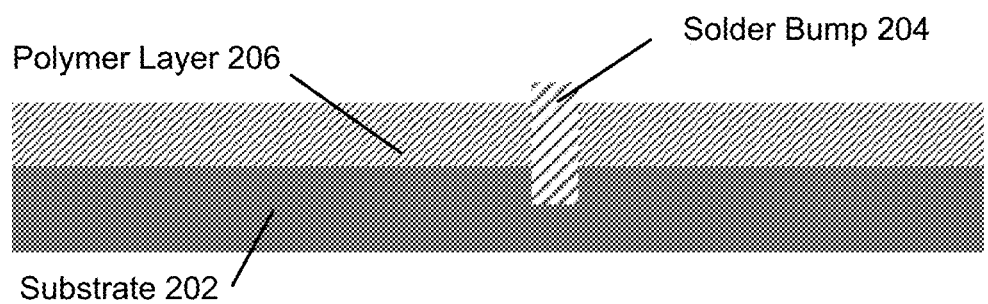

In a next step, a polymer layer 206 can be deposited on the frontside surface of the substrate 202, as shown in FIG. 2B. Similar to the polymer layer 110, the polymer layer 206 may be deposited by vapor phased deposition techniques, for example, a CVD process or a PVD process. As shown in FIG. 2C, the polymer layer 206 can be further planarized using a planarization technique, for example, a CMP process, a grind process, or an etch process, to expose the solder bump 204. In this example, the planarization process may continue until the solder bump 204 is a few micrometers protruded from the top surface of the polymer layer 206. In another example embodiment, the polymer layer 110 can be etched back, e.g., by a wet etching or a dry etching technique, to protrude the solder bump 204 thereon.

Figure 2D:
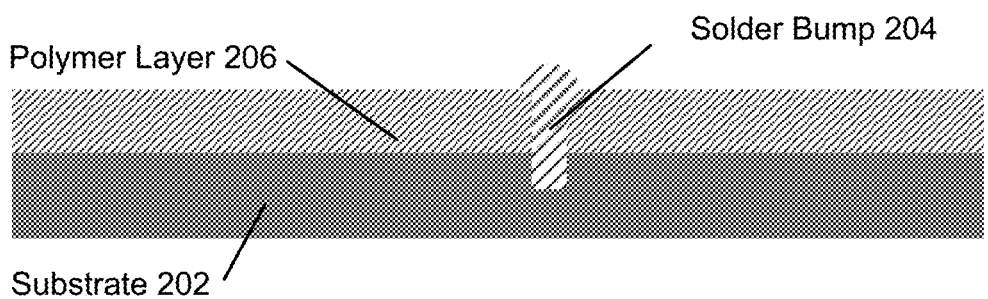

After the solder bump 204 is exposed from the polymer layer 206, as shown in FIG. 2D, a reflow process can be conducted on the solder bump 204 to form a solder ball and assist the semiconductor device assemblies. The purposes of the solder bump 204 reflow are to increase the bump height by reshaping the exposed solder bump into a sphere and to facilitate the solder-TSV bonding described later in this disclosure. A reflowed solder ball above the planarized polymer layer 206 may perform better reliability and can be conducted in a rapid thermal process (RTP) in nitrogen atmosphere.

In another example embodiment, the semiconductor device 200 may include a plurality of solder bumps located on its frontside surface. The processes of the plurality of solder bumps can be same to that of the solder bump 204 described in FIGS. 2A-2D.

Figure 3:
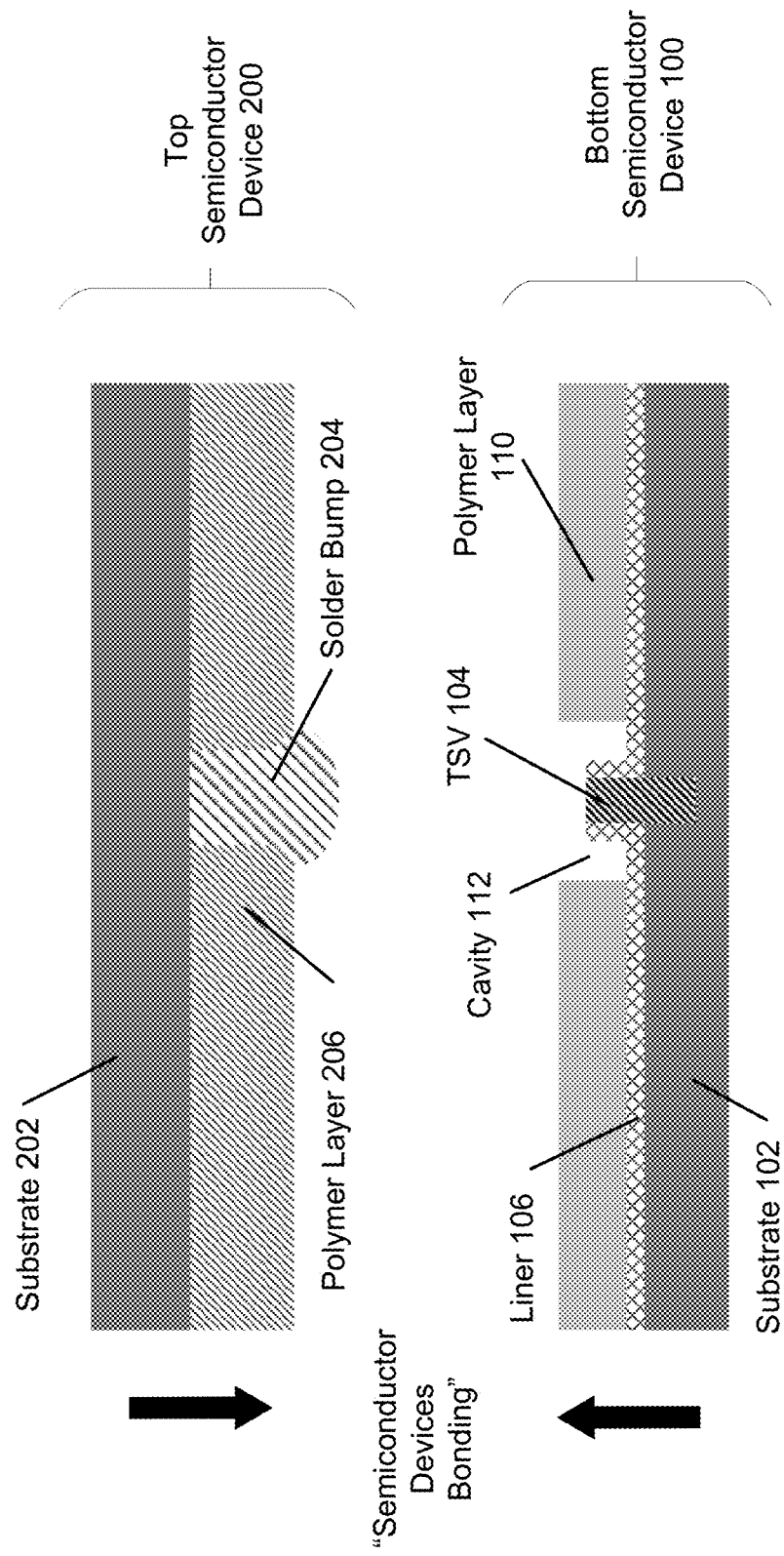
FIG. 3 depicts a cross-section view of the solder based hybrid bonding of the first and the second semiconductor devices according to embodiments of the invention.

FIG. 3 depicts a cross-section view of the solder-based hybrid bonding of the first semiconductor device 100 and the second semiconductor device 200 according to embodiments of the invention. The bonding of the semiconductor devices may include flipping the second semiconductor device 200 and aligning its frontside surface with the backside surface of the first semiconductor device 100. Additionally, the solder bump 204 of the semiconductor device 200 can be also aligned with the TSV 104 of the first semiconductor device 100 for the solder-TSV bonding. In this example, the semiconductor devices 100 and 200 can be stacked by contacting the polymer layer 206 and the solder bump 204 of the second semiconductor device 200 to the polymer layer 110 and the TSV 104 of the first semiconductor device 100, respectively. In particular, the semiconductor devices stacking can be done by a polymer to polymer bonding, e.g., the bonding between the polymer layer 206 and the polymer layer 110 at less than 200° C. without any underfill. The polymer layers of the first and second semiconductor devices 100 and 200, as discussed earlier, may be made of thermoset or thermoplastic materials such as epoxies, silicones, acrylics, bismaleimides, and polyimides. These polymer layers are cross-linked and become harder when they are in contact and subjected to elevated temperatures after stacking. Once the semiconductor devices 100 and 200 are stacked, a final mass reflow can be conducted to form the solder wetting in which the solder bump 204 becomes fluid molten and adheres properly to the conductive top surface of the TSV 104 for the solder-TSV bonding. In this example, the cavity 112 may have a volume greater than the protruded solder bump 204, so that it can accommodate all solder material after the solder-TSV bonding procedure.

Figure 4:
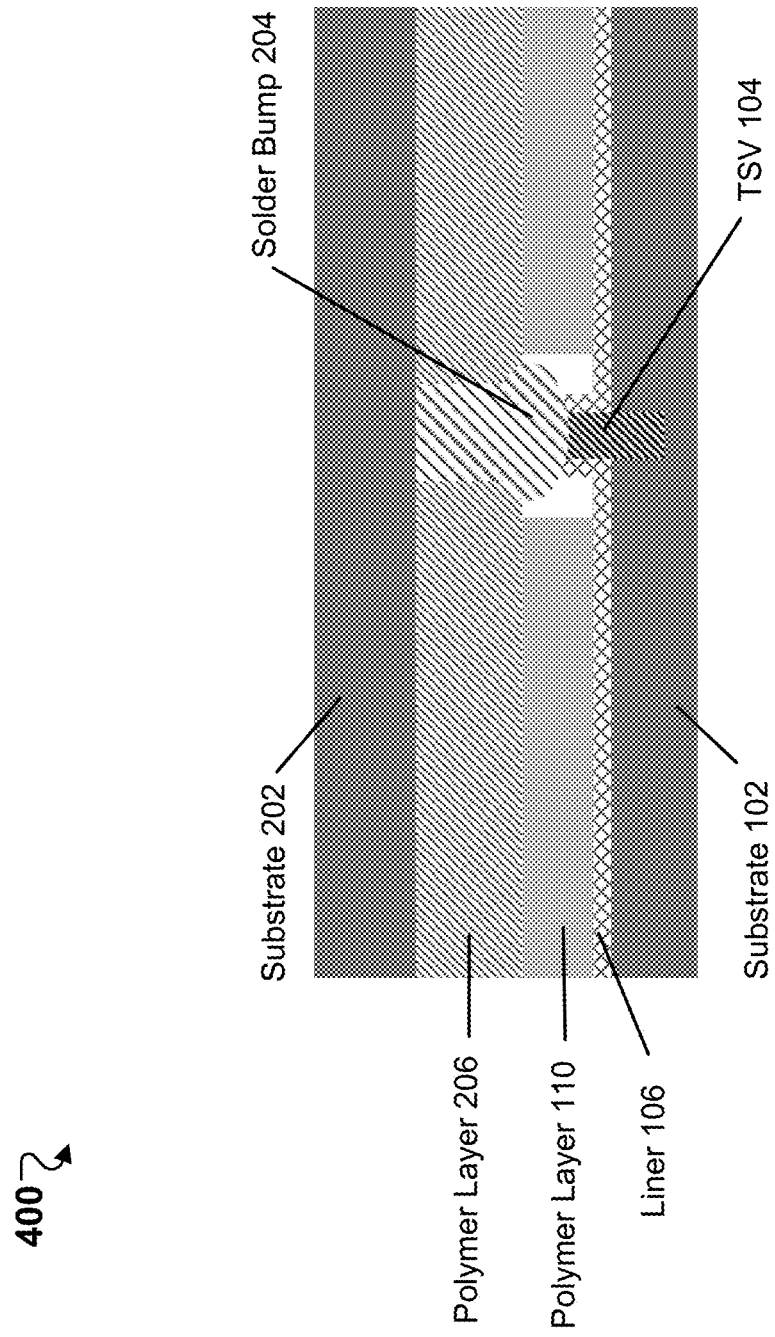
FIG. 4 depicts a cross-section view of a semiconductor device assembly with hybrid bonding interconnections according to embodiments of the invention.

Turning to FIG. 4, a cross-section view of a stacked semiconductor devices 100 and 200 with hybrid bonding interconnections according to embodiments of the invention is depicted. During the semiconductor devices stacking, the solder bump 204 is soft but not melt. As a result and as shown in FIG. 4, the bulk of the solder bump 204 may contact the TSV 104 and be accommodated within the cavity 112 of the semiconductor device 100. This way, the solder ball of the solder bump 204 does not flow into the interface of the first and second semiconductor device 100 and 200, therefore eliminating any BLT therebetween. In this example, the hybrid bonding between the stacked first and second semiconductor devices 100 and 200 includes the polymer-polymer bonding between the polymer layer 206 and the polymer layer 110, and the solder-TSV bonding between the solder bump 204 and the TSV 104 and located in the cavity 112 of the first semiconductor device 100. This hybrid bonding for semiconductor device assemblies can effectively reduce device yield losses due to solder bridging and non-wetting issues. Moreover, in an example embodiment, the wetted solder ball can adhere the protruded TSV 104 but may not completely fill the cavity 112. This may leave voids in the cavity 112 but will not cause reliability issues to the stacked semiconductor devices because the polymer layers are well bonded therebetween.

In another example embodiment, the semiconductor device assemblies described in this disclosure include bonding the first and second semiconductor devices 100 and 200 so that the polymer layer 206 contacts the polymer layer 110, and each of the plurality of solder bumps located on the frontside surface of the semiconductor device 200 extends into a corresponding one of the plurality of TSVs protruding from the backside surface of the second semiconductor device 200. In another example embodiment, the TSV 104 and the solder bump 204 penetrate through the substrate 102 and the substrate 202 respectively in the hybrid bonding interconnections.

Figure 5:
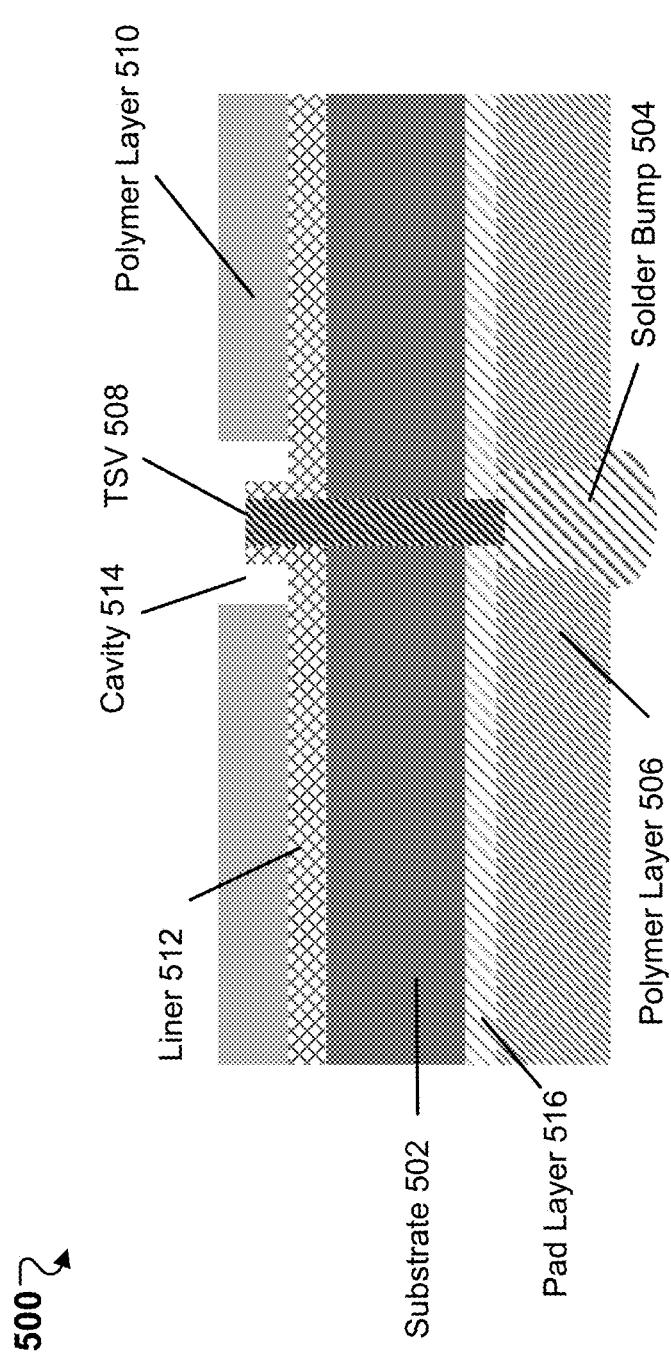
FIG. 5 depicts a cross-section view of a third semiconductor device according to embodiments of the invention.

In an example embodiment, this disclosure reveals a third semiconductor device assembly by stacking a plurality of semiconductor devices on top of each other. FIG. 5 depicts a cross-section view of this type of semiconductor device according to embodiments of the invention. In this example, the semiconductor device 500 may include a frontside surface and a backside surface, each containing different materials and structures for the hybrid bonding of the semiconductor device assemblies. As shown in FIG. 5 and on the frontside surface, a TSV 508 can be fabricated and protruded thereon. The sidewall of the TSV 508 may be encapsulated by a passivation liner 512 and the top surface of the TSV 508 can be exposed. Specifically, a polymer layer 510 can be deposited on the frontside surface of the semiconductor device 500 and a cavity 514 may be patterned thereon. In particular, the cavity 514 can be formed around the protruded TSV 508 with a diameter ranging from 5 um to 10 um. In this example, the material selection and fabrication procedures for the polymer layer 510, the TSV 508, the liner 512, and the cavity 514 may be same to that described in FIGS. 1A-1D for the semiconductor device 100.

Further, the semiconductor device 500 may include a solder bump 504, a polymer layer 506, and a pad layer 516 located on the backside surface of the substrate 502. As shown in FIG. 5, the polymer layer 506 may encapsulate the backside surface and the solder bump 504 may sit on the pad layer 516 and be protruded above the polymer layer 506. Here, the TSV 508 fully extends through the substrate 502 and is in contact with the solder bump 504. In this example, the material selection and fabrication procedures for the polymer layer 506 and the solder bump 504 may be same to that described in FIGS. 2A-2D for the semiconductor device 200.

In this example embodiment, semiconductor devices, e.g., a plurality of the semiconductor device 500, can be stacked on top of each other by the hybrid bonding for semiconductor device assemblies. For example, a backside surface of a first semiconductor device 500 can be attacked to and bonded with a frontside surface of a second semiconductor device 500' through a polymer-polymer bonding and a solder-TSV bonding. Here, the polymer-polymer bonding can be formed between the polymer layer 506 of the first semiconductor device 500 and the polymer layer 510' of the second semiconductor device 500'. On the other hand, the solder-TSV bonding can be formed between the solder bump 504 of the first semiconductor device 500 and the TSV 508' of the second semiconductor device 500'. Specifically, the bulk of the solder bump 504 of the first semiconductor device 500 may contact the TSV 104' of the semiconductor device 500' and can be accommodated within the cavity 514' of the semiconductor device 500'. In this assembly, solder ball of the solder bump 504 may be limited in the cavity 512' and does not flow into the interface of the first and second semiconductor devices 500 and 500', therefore eliminating any BLT therebetween. The above described fabrication procedures can be repeated to further stack more of the plurality of semiconductor devices 500 in the semiconductor device assemblies.

In another example embodiment, one or more of the semiconductor device 500 can be connected to other circuitries of a device. For example, the TSV 508 of the semiconductor device 500 may be connected, through its exposed top surface, to another circuitry of the device for electrical connection. In another example, the solder bump 504 of the semiconductor device 500 can be connected to another circuitry of the device.

FIG. 6 is a flow chart illustrating a method 600 of semiconductor device assembly with the solder based hybrid bonding according to embodiments of the invention. Referring to FIGS. 1-5, the method 600 includes processing a first semiconductor device to create a cavity in a first polymer layer around a protruded TSV on a backside surface of the first semiconductor device, at 602. For example, the TSV 104 can be fabricated on the backside surface of the semiconductor device 100 and protruded thereon. Specifically, the cavity 112 can be formed by patterning the polymer layer 110 of the semiconductor device 100 and located around the protruded TSV 104.

The method 600 also includes processing a second semiconductor device to create a second polymer layer and a solder bump on a frontside surface of the second semiconductor device, at 604. For example, the second semiconductor device 200 can be processed to have the polymer layer 206 deposited on its frontside surface and the solder bump 204 exposed above the polymer layer 206.

Further, the method 600 includes bonding the first semiconductor device to the second semiconductor device such that the first polymer layer contacts the second polymer layer and the solder bump extends into the cavity and contacts the TSV, at 606. For example, the first and second semiconductor devices 100 and 200 can be stacked to form the hybrid bonding therebetween. Specifically, the polymer-polymer bonding may be formed between the polymer layer 206 and the polymer layer 110. Moreover, the solder-TSV bonding can be formed between the solder bump 204 and the TSV 104 within the cavity 112 of the first semiconductor device 100.

Lastly, the method 600 includes reflowing the solder bump to wet the protruded TSV within the cavity, at 608. For example, after the first and second semiconductor devices 100 and 200 are bonded, a mass reflow process may be conducted to form solder wetting in which the solder bump 204 becomes fluid molten and adheres properly to the top surface of the TSV 104 for conductive solder-TSV bonding.

Turning now to FIG. 7, FIG. 7 is a flow chart illustrating a method 700 of fabricating the first semiconductor device for the semiconductor device assemblies according to embodiments of the invention. Referring to FIGS. 1A-1D, the method 700 includes etching the backside surface of the first semiconductor device to reveal the TSV protruded therefrom, at 702. For example, the backside surface of the substrate 102 of the semiconductor device 100 can be thinned to reveal the TSV 104 thereon. The method 700 also includes depositing a liner on the backside surface of the first semiconductor device and on the protruded TSV, at 704. For example, the liner 106 may be deposited and conformally coated on the backside surface of the substrata 102 and sidewalls and top surface of the protruded TSV 104. In addition, the method 700 includes planarizing the backside surface of the first semiconductor device to expose a top surface of the TSV, at 706. For example, the liner 106 can be further planarized with assistance of the TBM material 108 to expose the top surface of the TSV 104. Further, the method 700 includes depositing the first polymer layer on the backside surface of the first semiconductor device, at 708. For example, the polymer layer 110 can be deposited on the backside surface of the substrate 102. Lastly, the method 700 includes patterning the first polymer layer to create the cavity around the protruded TSV, at 710. For example, the polymer layer 110 can be patterned to form the cavity 112 therein, and the cavity 112 may be around the protruded TSV 104.

Figure 8:
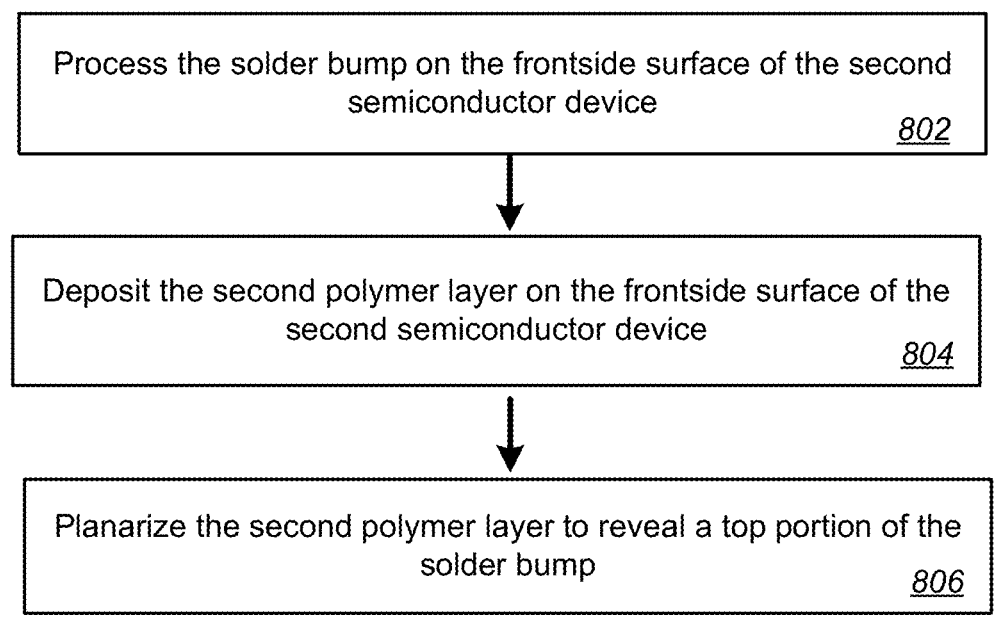
FIG. 8 is a flow chart illustrating a method of fabricating the second semiconductor device for the semiconductor device assembly according to embodiments of the invention.

FIG. 8 is a flow chart illustrating a method 800 of fabricating the second semiconductor device for the semiconductor device assemblies according to embodiments of the invention. Referring to FIGS. 2A-2D, the method 800 includes processing the solder bump on the frontside surface of the second semiconductor device, at 802. For example, the solder bump 204 can be fabricated on the frontside surface of the substrate 202 of the semiconductor device 200. The method 800 also includes depositing the second polymer layer on the frontside surface of the second semiconductor device, at 804. For example, the polymer layer 206 can be deposited on the backside surface of the substrate 202. Further, the method 800 includes planarizing the second polymer layer to reveal a top portion of the solder bump, at 806. For example, the polymer layer 206 may be polarized to expose the solder bump 204 thereabove. In another example embodiment, a reflow process may be further conducted on the semiconductor device. For example, the semiconductor device 200 can be reflowed to reshape the exposed solder bump 204 into a sphere in assisting the solder-TSV bonding in downstream procedures of the semiconductor device assemblies.

The semiconductor device interconnections described herein may be implemented in a wafer-wafer bonding, a die-die bonding, a die-wafer bonding, or any combinations thereof.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a first semiconductor device, including:
      a first substrate with a frontside surface,
      a plurality of solder bumps located on the frontside surface of the first substrate, and
      a first polymer layer on the frontside surface of the first substrate; and
   a second semiconductor device, including:
      a second substrate with a backside surface,
      a plurality of through silicon vias (TSVs) protruding from the backside surface of the second substrate, and
      a second polymer layer on the backside surface of the first substrate, the second polymer layer having a plurality of openings corresponding to the plurality of TSVs, each opening having a volume greater than a volume of the plurality of solder bumps,
   wherein the first semiconductor device and the second semiconductor device are bonded such that the first polymer layer contacts the second polymer layer and each of the plurality of solder bumps extends into a corresponding one of the plurality of openings and contacts a corresponding one of the plurality of TSVs.

2. The semiconductor device assembly of claim 1, wherein voids exist within one or more of the plurality of openings.

3. The semiconductor device assembly of claim 1, wherein the first polymer layer is bonded to the second polymer layer.

4. The semiconductor device assembly of claim 1, wherein a pitch of the plurality of TSVs is less than 10 um.

5. The semiconductor device assembly of claim 1, wherein a diameter of the plurality of TSVs ranges from 2 um to 4 um, and wherein a diameter of the plurality of openings ranges from 5 um to 10 um.

6. The semiconductor device assembly of claim 1, wherein a top surface of each of the plurality of TSVs is recessed below a top surface of the second polymer layer.

7. The semiconductor device assembly of claim 1, further comprising a dielectric layer encapsulating the backside surface of the second substrate and protruding sidewalls of the plurality of TSVs.

8. The semiconductor device assembly of claim 1, wherein the first polymer layer and the second polymer layer are made of materials including at least one of epoxies, silicones, acrylics, bismaleimides, or polyimides.

9. The semiconductor device assembly of claim 1, wherein the plurality of TSVs are made of conductive materials including at least one of copper, tungsten, molybdenum, nickel, titanium, tantalum, platinum, silver, gold, ruthenium, iridium, rhenium, rhodium, or alloys thereof.

10. The semiconductor device assembly of claim 1, wherein each of the plurality of solder bumps includes a nickel pillar capped with a solder material.

11. A semiconductor device assembly, comprising:
   a plurality of semiconductor devices, each of the plurality of semiconductor devices including:
      a substrate with a frontside surface and a backside surface,
      a plurality of solder bumps located on the frontside surface of the substrate, a first polymer layer on the frontside surface of the substrate, a plurality of through silicon vias (TSVs) protruding from the backside surface of the substrate, and a second polymer layer on the backside surface of the substrate, the second polymer layer having a plurality of openings corresponding to the plurality of TSVs, each opening having a volume greater than a volume of the plurality of solder bumps.

12. The semiconductor device assembly of claim 11, wherein a first semiconductor device of the plurality of semiconductor devices and a second semiconductor device of the plurality of semiconductor devices are bonded such that:

the first polymer layer of the first semiconductor device contacts the second polymer layer of the second semiconductor device, and each of the plurality of solder bumps of the first semiconductor device extends into a corresponding one of the plurality of openings of the second semiconductor device and contacts a corresponding one of the plurality of TSVs of the second semiconductor device.

13. A method of fabricating a semiconductor device assembly, comprising:

processing a first semiconductor device to create a cavity in a first polymer layer around a protruded through silicon via (TSV) on a backside surface of the first semiconductor device;

processing a second semiconductor device to create a second polymer layer and a solder bump on a frontside surface of the second semiconductor device;

bonding the first semiconductor device to the second semiconductor device such that the first polymer layer contacts the second polymer layer and the solder bump extends into the cavity and contacts the TSV; and reflowing the solder bump to wet the protruded TSV within the cavity.

14. The method of claim 13, wherein processing the first semiconductor device comprises:

etching the backside surface of the first semiconductor device to reveal the TSV protruded therefrom, depositing a liner on the backside surface of the first semiconductor device and on the protruded TSV, planarizing the backside surface of the first semiconductor device to expose a top surface of the TSV, depositing the first polymer layer on the backside surface of the first semiconductor device, and patterning the first polymer layer to create the cavity around the protruded TSV.

15. The method of claim 14, wherein planarizing the backside surface of the first semiconductor device comprises a fly cutting process, and wherein the exposed top surface of the TSV is recessed below a top surface of the patterned first polymer layer.

16. The method of claim 14, further comprising removing, after patterning the first polymer layer to create the cavity, the liner from a sidewall of the protruded TSV.

17. The method of claim 13, wherein processing the second semiconductor device comprises:

processing the solder bump on the frontside surface of the second semiconductor device, depositing the second polymer layer on the frontside surface of the second semiconductor device, and planarizing the second polymer layer to reveal a top portion of the solder bump.

18. The method of claim 17, wherein planarizing the second polymer layer comprises at least one of a chemical-mechanical planarization (CMP) process, a grind process, or an etch process.

19. The method of claim 17, further comprising reflowing the solder bump to form a solder ball above the planarized second polymer layer.

20. The method of claim 13, wherein bonding the first semiconductor device to the second semiconductor device comprises bonding the first polymer layer and the second polymer layer.

* * * * *